US007481950B2

(12) United States Patent
Yamada et al.

(10) Patent No.: US 7,481,950 B2
(45) Date of Patent: Jan. 27, 2009

(54) POLISHING COMPOSITION AND POLISHING METHOD USING THE SAME

(75) Inventors: Shuhei Yamada, Nagoya (JP); Akihiro Kawase, Kasugai (JP)

(73) Assignee: Fujimi Incorporated, Nishikasugai-gun, Aichi (JP)

( * ) Notice: Subject to any disclaimer, the term of this patent is extended or adjusted under 35 U.S.C. 154(b) by 0 days.

(21) Appl. No.: 10/673,779

(22) Filed: Sep. 29, 2003

(65) Prior Publication Data

US 2004/0127047 A1 Jul. 1, 2004

(30) Foreign Application Priority Data

Sep. 30, 2002 (JP) ............................. 2002-287448

(51) Int. Cl.
*C09K 5/00* (2006.01)
(52) U.S. Cl. .................... 252/79.1; 252/79.2; 252/79.3; 252/79.4; 252/79.5
(58) Field of Classification Search ................. 216/89; 438/693; 252/79.1, 79.5, 79.2, 79.3, 79.4
See application file for complete search history.

(56) References Cited

U.S. PATENT DOCUMENTS

| | | | | |
|---|---|---|---|---|
| 3,715,842 | A | 2/1973 | Tredinnick et al. ............. 51/281 |
| 3,874,129 | A * | 4/1975 | Deckert et al. ................. 451/41 |
| 4,169,337 | A | 10/1979 | Payne ........................... 51/283 |
| 4,310,594 | A | 1/1982 | Yamazaki et al. ............. 428/296 |
| 4,462,188 | A | 7/1984 | Payne ........................ 51/283 R |
| 4,588,421 | A | 5/1986 | Payne ........................... 51/308 |
| 5,352,277 | A | 10/1994 | Sasaki ............................ 106/6 |
| 5,709,588 | A * | 1/1998 | Muroyama ..................... 451/41 |
| 5,904,159 | A * | 5/1999 | Kato et al. ....................... 134/7 |
| 6,354,913 | B1 * | 3/2002 | Miyashita et al. ............. 451/41 |
| 6,527,818 | B2 * | 3/2003 | Hattori et al. ................. 51/308 |
| 6,685,757 | B2 * | 2/2004 | Xu et al. ........................ 51/308 |
| 2001/0003672 | A1 | 6/2001 | Inoue et al. .................. 438/690 |
| 2002/0151252 | A1 | 10/2002 | Kawase et al. ................ 451/36 |
| 2004/0020134 | A1 * | 2/2004 | Kim et al. ..................... 51/307 |

FOREIGN PATENT DOCUMENTS

| | | |
|---|---|---|
| EP | 0 773 270 A2 | 11/1996 |
| EP | 1 123 956 A1 | 2/2001 |
| JP | 49-076470 | 4/1975 |
| JP | 02-158684 | 6/1990 |
| JP | 08-113772 | 5/1996 |
| JP | 08-302338 | * 11/1996 |
| JP | 10-309660 | 11/1998 |
| JP | 11-116942 | 4/1999 |
| JP | 11-214338 | 8/1999 |
| JP | 2001-118815 | * 4/2001 |
| WO | 02/31072 A1 | 4/2002 |

OTHER PUBLICATIONS

U.S. Appl. No. 09/691,263, filed Oct. 19, 2003, Yutaka Inoue, and Masatoki Ito.
"Superprecision Wafer Surface Control Technology", Science Forum Inc., the first edition, p. 215.

* cited by examiner

*Primary Examiner*—George A. Goudreau
(74) *Attorney, Agent, or Firm*—Vidas, Arrett & Steinkraus

(57) ABSTRACT

A polishing composition of the present invention, which is used in precision polishing the surface of a wafer for semiconductor devices, remarkably reduces haze that occurs on the surface of the wafer. The polishing composition includes silicon dioxide, an alkaline compound, a water-soluble polymer, and water. The silicon dioxide is colloidal silica or fumed silica. The average primary particle diameter $D_{SA}$ of the colloidal silica is from 5 to 30 nm, and the average secondary particle diameter $D_{N4}$ of the colloidal silica is from 5 to 120 nm. The average primary particle diameter $D_{SA}$ of the fumed silica is from 5 to 30 nm, and the average secondary particle diameter $D_{N4}$ of the fumed silica is from 5 to 200 nm.

15 Claims, No Drawings

POLISHING COMPOSITION AND POLISHING METHOD USING THE SAME

BACKGROUND OF THE INVENTION

The present invention relates to a polishing composition used in precision polishing the surface of a wafer for semiconductor devices and a polishing method using the same.

A wafer cut out from an ingot is generally subjected to coarse polishing in a wrapping process, then, further subjected to precision polishing in a polishing process. Conventional polishing composition used in the polishing process is disclosed in Japanese Laid-Open Patent Publication No. 49-76470, Japanese Laid-Open Patent Publication No. 2-158684, Japanese Laid-Open Patent Publication No. 8-113772, Japanese Laid-Open Patent Publication No. 10-309660, Japanese Laid-Open Patent Publication No. 11-214338, and Japanese Laid-Open Patent Publication No. 11-116942.

During a processing of a wafer, haze occurs on the surface of the wafer in some cases. Haze not only decreases the electric property and yield of a semiconductor device but also becomes a cause for decrease in the detection limit in measuring particles adhered on the surface of the wafer. As the quality required for wafers is becoming even stricter with higher performance and higher integration and density of semiconductor devices being required, the haze levels of the surface of the wafer precision polished by the conventional polishing composition is not necessarily sufficient at present.

SUMMARY OF THE INVENTION

Accordingly, it is an objective of the present invention to provide a polishing composition capable of remarkably reducing haze that occurs on a wafer surface, and a polishing method using the same.

To achieve the above objective, the present invention provides a polishing composition used in precision polishing a wafer surface. The polishing composition includes silicon dioxide, an alkaline compound, a water-soluble polymer, and water. The silicon dioxide is colloidal silica or fumed silica. The average primary particle diameter $D_{SA}$ of the colloidal silica, which is obtained from the specific surface area of the colloidal silica measured by the BET method, is from 5 to 30 nm. The average secondary particle diameter $D_{N4}$ of the colloidal silica, which is measured by a laser scattering method, is from 5 to 120 nm. The average primary particle diameter $D_{SA}$ of the fumed silica, which is obtained from the specific surface area of the fumed silica measured by the BET method, is from 5 to 30 nm. The average secondary particle diameter $D_{N4}$ of the fumed silica, which is measured by a laser scattering method, is from 5 to 200 nm.

The present invention also provides a method of polishing a wafer. The method includes preparing a polishing composition and precision polishing the surface of the wafer using the polishing composition. The polishing composition includes silicon dioxide, an alkaline compound, a water-soluble polymer, and water. The silicon dioxide is colloidal silica or fumed silica. The average primary particle diameter $D_{SA}$ of the colloidal silica, which is obtained from the specific surface area of the colloidal silica measured by the BET method, is from 5 to 30 nm. The average secondary particle diameter $D_{N4}$ of the colloidal silica, which is measured by a laser scattering method, is from 5 to 120 nm. The average primary particle diameter $D_{SA}$ of the fumed silica, which is obtained from the specific surface area of the fumed silica measured by the BET method, is from 5 to 30 nm. The average secondary particle diameter $D_{N4}$ of the fumed silica, which is measured by a laser scattering method, is from 5 to 200 nm.

Other aspects and advantages of the invention will become apparent from the following description, illustrating by way of example the principles of the invention.

DETAILED DESCRIPTION OF THE PREFERRED EMBODIMENTS

One embodiment of the present invention will be described below.

A polishing composition according to this embodiment consists of silicon dioxide, an alkaline compound, a water-soluble polymer, and water.

The above-mentioned silicon dioxide mechanically polishes an object to be polished. The silicon dioxide is colloidal silica or fumed silica, preferably colloidal silica.

The average primary particle diameter $D_{SA}$ of the silicon dioxide obtained from the specific surface area of the silicon dioxide measured by the BET method is from 5 to 30 nm, preferably from 5 to 25 nm, more preferably from 5 to 20 nm. When the silicon dioxide is colloidal silica, the average secondary particle diameter $D_{N4}$ of the silicon dioxide measured by a laser scattering method is from 5 to 120 nm, preferably from 5 to 100 nm, more preferably from 5 to 80 nm. When the silicon dioxide is fumed silica, the average secondary particle diameter $D_{N4}$ is from 5 to 200 nm.

The content of the silicon dioxide in the polishing composition is preferably from 0.1 to 40 wt %, more preferably from 0.5 to 30 wt %, further preferably from 1 to 20 wt %.

The above-mentioned alkaline compound chemically polishes an object to be polished.

Specific examples of the alkaline compound include inorganic alkaline compounds such as potassium hydroxide, sodium hydroxide, potassium hydrogencarbonate, potassium carbonate, sodium hydrogencarbonate, and sodium carbonate; ammonia; ammonium salts such as tetramethylammonium hydroxide, ammonium hydrogencarbonate, and ammonium carbonate; amines such as methylamine, dimethylamine, trimethylamine, ethylamine, diethylamine, triethylamine, ethylenediamine, monoethanolamine, N-(β-aminoethyl)ethanolamine, hexamethylenediamine, diethylenetriamine, triethylenetetramine, anhydrous piperazine, piperazine hexahydrate, 1-(2-aminoethyl)piperazine, and N-methylpiperazine. Preferred alkaline compound is potassium hydroxide, sodium hydroxide, potassium hydrogencarbonate, potassium carbonate, sodium hydrogencarbonate, sodium carbonate, ammonia, tetramethylammonium hydroxide, ammonium hydrogencarbonate, ammonium carbonate, anhydrous piperazine, piperazine hexahydrate, 1-(2-aminoethyl)piperazine, or N-methylpiperazine; and particularly preferred alkaline compound is potassium hydroxide, sodium hydroxide, ammonia, tetramethylammonium hydroxide, anhydrous piperazine or piperazine hexahydrate. The polishing composition may contain only one kind of alkaline compound, or two or more kinds of alkaline compounds.

When the alkaline compound is other than either of piperazine or piperazine derivatives, the content of the alkaline compound in the polishing composition is preferably from 0.01 to 8 wt %, more preferably from 0.05 to 5 wt %, particularly preferably from 0.1 to 3 wt %. When the alkaline compound is anhydrous piperazine, 1-(2-aminoethyl)piperazine, or N-methylpiperazine, the content is preferably from 0.005 to 3 wt %, more preferably from 0.01 to 2 wt %, and particularly preferably 0.05 to 1.5 wt %. When the alkaline compound is piperazine hexahydrate, the content is preferably from 0.01 to 6 wt %, more preferably from 0.02 to 3 wt %, and particularly preferably from 0.2 to 1 wt %.

The above-mentioned water-soluble polymer is preferably hydroxyethyl cellulose, polyvinyl alcohol, or polyethylene oxide, and more preferably hydroxyethyl cellulose. The polishing composition may contain only one kind of water-soluble polymer, or two or more kinds of water-soluble polymers.

The average molecular weight of the hydroxyethyl cellulose is preferably from 300,000 to 3,000,000; more preferably from 600,000 to 2,000,000; and particularly preferably from 900,000 to 1,500,000. The average molecular weight of the polyvinyl alcohol is preferably from 1,000 to 1,000,000; more preferably from 5,000 to 500,000; and particularly preferably from 10,000 to 300,000. The average polymerization degree of the polyvinyl alcohol is preferably from 200 to 3,000, and the saponification degree of the polyvinyl alcohol is preferably from 70 to 100%. The average molecular weight of the polyethylene oxide is preferably from 20,000 to 50,000,000; more preferably from 20,000 to 30,000,000; and particularly preferably from 20,000 to 10,000,000.

When the water-soluble polymer is the hydroxyethyl cellulose, the content of the water-soluble polymer in the polishing composition is preferably from 0.005 to 1.5 wt %, more preferably from 0.02 to 0.8 wt %, and particularly preferably from 0.05 to 0.5 wt %. When the water-soluble polymer is the polyvinyl alcohol, the content is preferably from 0.001 to 2 wt %, more preferably from 0.005 to 1 wt %, and particularly preferably from 0.02 to 0.5 wt %. When the water-soluble polymer is the polyethylene oxide, the content is preferably from 0.001 to 1 wt %, more preferably from 0.005 to 0.5 wt %, and particularly preferably from 0.01 to 0.2 wt %.

The above-mentioned water serves as a medium of dispersing or dissolving components other than the water, contained in the polishing composition. It is preferred that the water should contain as few impurities as possible. Preferable water is ion exchanged water filtrated through a filter or distilled water.

Next, a method will be described of producing a wafer for semiconductor devices, including a process of precision polishing a wafer surface by the above-mentioned polishing composition.

The process of producing a polished wafer from an ingot includes a slicing process, beveling process, wrapping process, etching process, edge polishing process, and polishing process. In the slicing process, a wafer is cut from an ingot. In the subsequent beveling process, the edge of the wafer is beveled. In the subsequent wrapping process, the surface of the wafer is coarsely polished. In the subsequent etching process, a process-modified layer generated on the surface of the wafer in prior processes to the etching process is removed. In the subsequent edge polishing process, the beveled edge of the wafer is polished. In the subsequent polishing process, the surface of the wafer is precisely polished.

The above-mentioned polishing composition is used in the polishing process of this series of processes. In the polishing process, the surface of the wafer is polished by allowing the surface of the wafer to contact with a polishing member and by allowing relative sliding of the surface of the wafer and the polishing member while feeding the polishing composition to this contact portion.

The embodiment of the present invention provides the following advantages.

When the surface of the wafer is precisely polished by the polishing composition according to this embodiment, haze that occurs on the surface of the wafer is remarkably reduced. Consequently, the electric property and yield of a semiconductor device are improved, and the detection limit when particles adhered to the wafer are counted by a particle counter is also improved.

The average primary diameter $D_{SA}$ of the silicon dioxide contained in the polishing composition is 30 nm or less. Therefore, an increase in haze caused by excessiveness of average primary diameter $D_{SA}$ of the silicon dioxide is prevented. Additionally prevented are the occurrence of scratch on the surface of the wafer and increase in surface roughness of the wafer, caused by excessiveness of average primary diameter $D_{SA}$ of the silicon dioxide. The above-mentioned effects are improved when the average primary diameter $D_{SA}$ is 25 nm or less, and the above-mentioned effects are further improved when the average primary diameter $D_{SA}$ is 20 nm or less.

When the silicon dioxide contained in the polishing composition is colloidal silica, the average secondary particle diameter $D_{N4}$ of the silicon dioxide is 120 nm or less, and when the silicon dioxide contained in the polishing composition is fumed silica, the average secondary particle diameter $D_{N4}$ of the silicon dioxide is 200 nm or less. This prevents an increase in haze caused by excessiveness of average secondary diameter $D_{N4}$ of the silicon dioxide. Additionally prevented is the occurrence of scratches on the surface of the wafer and increase in surface roughness of the wafer, caused by excessiveness of average secondary particle diameter $D_{N4}$ of the silicon dioxide. The above-mentioned effects are improved when the silicon dioxide contained in the polishing composition is colloidal silica and the average secondary particle diameter $D_{N4}$ of the silicon dioxide is 100 nm or less, and the above-mentioned effects are further improved when the average secondary particle diameter $D_{N4}$ is 80 nm or less.

Occurrence of scratches on the surface of the wafer is particularly suppressed when the silicon dioxide contained in the polishing composition is colloidal silica.

Extreme decrease in polishing speed caused by too small content is prevented when the content of the silicon dioxide in the polishing composition is 0.1 wt % or more. The above-mentioned effects are improved when the content is 0.5 wt % or more, and the above-mentioned effects are further improved when the content is 1 wt % or more.

Increase in viscosity of the polishing composition caused by excess content is prevented when the content of the silicon dioxide in the polishing composition is 40 wt % or less. The above-mentioned effects are improved when the content is 30 wt % or less, and the above-mentioned effects are further improved when the content is 20 wt % or less.

Polishing speed increases when the alkaline compound contained in the polishing composition is at least one selected from potassium hydroxide, sodium hydroxide, potassium hydrogencarbonate, potassium carbonate, sodium hydrogencarbonate, sodium carbonate, ammonia, tetramethylammonium hydroxide, ammonium hydrogencarbonate, ammonium carbonate, anhydrous piperazine, piperazine hexahydrate, 1-(2-aminoethyl)piperazine and N-methylpiperazine. Pollution of the wafer by metal impurities in the polishing composition is suppressed when the alkaline compound contained in the polishing composition is at least one selected from potassium hydroxide, sodium hydroxide, ammonia, tetramethylammonium hydroxide, anhydrous piperazine and piperazine hexahydrate.

Extreme decrease in polishing speed caused by too small content is prevented when the alkaline compound contained in the polishing composition is a compound other than either of piperazine or piperazine derivatives and the content of the alkaline compound is 0.01 wt % or more, when the alkaline compound contained in the polishing composition is anhydrous piperazine, 1-(2-aminoethyl)piperazine, or N-methylpiperazine and the content of the alkaline compound is 0.005 wt % or more; and when the alkaline compound contained in the polishing composition is piperazine hexahydrate and the content of the alkaline compound is 0.01 wt % or more. The above-mentioned effect is improved when the alkaline compound contained in the polishing composition is a compound other than either of piperazine or piperazine derivatives and the content of the alkaline compound is 0.05 wt % or more, when the alkaline compound contained in the polishing composition is anhydrous piperazine, 1-(2-aminoethyl)piperazine or N-methylpiperazine and the content of the alkaline compound is 0.01 wt % or more, and when the alkaline compound contained in the polishing composition is piperazine hexahydrate and the content of the alkaline compound is 0.02 wt % or more. The above-mentioned effect is further improved when the alkaline compound contained in the polishing composition is a compound other than either of piperazine of piperazine derivatives and the content of the alkaline compound is 0.1 wt % or more; when the alkaline compound contained in the polishing composition is anhydrous piperazine, 1-(2-aminoethyl)piperazine, or N-methylpiperazine and the content of the alkaline compound is 0.05 wt % or more; and when the alkaline compound contained in the polishing composition is piperazine hexahydrate and the content of the alkaline compound is 0.2 wt % or more.

Gelation and cost elevation of the polishing composition caused by excess content is prevented when the alkaline compound contained in the polishing composition is a compound other than either of piperazine or piperazine derivatives and the content of the alkaline compound is 8 wt % or less; when the alkaline compound contained in the polishing composition is anhydrous piperazine, 1-(2-aminoethyl)piperazine, or N-methylpiperazine and the content of the alkaline compound is 3 wt % or less; and when the alkaline compound contained in the polishing composition is piperazine hexahydrate and the content of the alkaline compound is 6 wt % or less. Additionally prevented is the surface roughening of the wafer caused by excess content of the alkaline compound. The above-mentioned effect is improved when the alkaline compound contained in the polishing composition is a compound other than either of piperazine or piperazine derivatives and the content of the alkaline compound is 5 wt % or less; when the alkaline compound contained in the polishing composition is anhydrous piperazine, 1-(2-aminoethyl)piperazine, or N-methylpiperazine and the content of the alkaline compound is 2 wt % or less; and when the alkaline compound contained in the polishing composition is piperazine hexahydrate and the content of the alkaline compound is 3 wt % or less. The above-mentioned effect is further improved when the alkaline compound contained in the polishing composition is a compound other than either of piperazine or piperazine derivatives and the content of the alkaline compound is 3 wt % or less; when the alkaline compound contained in the polishing composition is anhydrous piperazine, 1-(2-aminoethyl)piperazine, or N-methylpiperazine and the content of the alkaline compound is 1.5 wt % or less; and when the alkaline compound contained in the polishing composition is piperazine hexahydrate and the content of the alkaline compound is 1 wt % or less.

Haze is decreased when the water-soluble polymer contained in the polishing composition is at least one selected from hydroxyethyl cellulose, polyvinyl alcohol, and polyethylene oxide. The wetting property of the wafer is improved when the water-soluble polymer contained in the polishing composition is hydroxyethyl cellulose.

Haze is decreased when the water-soluble polymer contained in the polishing composition is hydroxyethyl cellulose and the content of the water-soluble polymer is 0.005 wt % or more; and when the water-soluble polymer contained in the polishing composition is polyvinyl alcohol or polyethylene oxide and the content of the water-soluble polymer is 0.001 wt % or more. The above-mentioned effect is improved when the water-soluble polymer contained in the polishing composition is hydroxyethyl cellulose and the content of the water-soluble polymer is 0.02 wt % or more; and when the water-soluble polymer contained in the polishing composition is polyvinyl alcohol or polyethylene oxide and the content of the water-soluble polymer is 0.005 wt % or more. The above-mentioned effect is further improved when the water-soluble polymer contained in the polishing composition is hydroxyethyl cellulose and the content of the water-soluble polymer is 0.05 wt % or more; when the water-soluble polymer contained in the polishing composition is polyvinyl alcohol and the content of the water-soluble polymer is 0.02 wt % or more, and when the water-soluble polymer contained in the polishing composition is polyethylene oxide and the content of the water-soluble polymer is 0.01 wt % or more.

Increase in viscosity of the polishing composition caused by excess content thereof is suppressed when the water-soluble polymer contained in the polishing composition is hydroxyethyl cellulose and the content of the water-soluble polymer is 1.5 wt % or less; when the water-soluble polymer contained in the polishing composition is polyvinyl alcohol and the content of the water-soluble polymer is 2 wt % or less; and when the water-soluble polymer contained in the polishing composition is polyethylene oxide and the content of the water-soluble polymer is 1 wt % or less. The above-mentioned effect is improved when the water-soluble polymer contained in the polishing composition is hydroxyethyl cellulose and the content of the water-soluble polymer is 0.8 wt % or less; when the water-soluble polymer contained in the polishing composition is polyvinyl alcohol and the content of the water-soluble polymer is 1 wt % or less; and when the water-soluble polymer contained in the polishing composition is polyethylene oxide and the content of the water-soluble polymer is 0.5 wt % or less. The above-mentioned effect is further improved when the water-soluble polymer contained in the polishing composition is hydroxyethyl cellulose or polyvinyl alcohol and the content of the water-soluble polymer is 0.5 wt % or less; and when the water-soluble polymer contained in the polishing composition is polyethylene oxide and the content of the water-soluble polymer is 0.2 wt % or less.

Haze is decreased when the water-soluble polymer contained in the polishing composition is hydroxyethyl cellulose having an average molecular weight of 300,000 or more; when the water-soluble polymer contained in the polishing composition is polyvinyl alcohol having an average molecular weight of 1,000 or more, and when the water-soluble polymer contained in the polishing composition is polyethylene oxide having an average molecular weight of 20,000 or more. The above-mentioned effect is improved when the water-soluble polymer contained in the polishing composition is hydroxyethyl cellulose having an average molecular weight of 600,000 or more; and when the water-soluble polymer contained in the polishing composition is polyvinyl alcohol having an average molecular weight of 5,000 or more. The above-mentioned effect is further improved when the water-soluble polymer contained in the polishing composition is hydroxyethyl cellulose having an average molecular weight of 900,000 or more; and when the water-soluble polymer contained in the polishing composition is polyvinyl alcohol having an average molecular weight of 10,000 or more.

Increase in viscosity of the polishing composition caused by excessiveness of average molecular weight of the water-soluble polymer is prevented when the water-soluble polymer contained in the polishing composition is hydroxyethyl cellulose having an average molecular weight of 3,000,000 or less; when the water-soluble polymer contained in the polishing composition is polyvinyl alcohol having an average molecular weight of 1,000,000 or less; and when the water-soluble polymer contained in the polishing composition is polyethylene oxide having an average molecular weight of 50,000,000 or less. The above-mentioned effect is improved when the water-soluble polymer contained in the polishing composition is hydroxyethyl cellulose having an average molecular weight of 2,000,000 or less; when the water-soluble polymer contained in the polishing composition is polyvinyl alcohol having an average molecular weight of 500,000 or less; and when the water-soluble polymer contained in the polishing composition is polyethylene oxide having an average molecular weight of 30,000,000 or less. The above-mentioned effect is further improved when the water-soluble polymer contained in the polishing composition is hydroxyethyl cellulose having an average molecular weight of 1,500,000 or less; when the water-soluble polymer contained in the polishing composition is polyvinyl alcohol having an average molecular weight of 300,000 or less; and when the water-soluble polymer contained in the polishing composition is polyethylene oxide having an average molecular weight of 10,000,000 or less.

It should be apparent to those skilled in the art that the present invention may be embodied in many other specific forms without departing from the spirit or scope of the invention. Particularly, it should be understood that the invention may be embodied in the following forms.

The polishing composition according to the embodiment may also contain known additives generally contained in conventional polishing compositions, for example, surfactants, chelating agents, preservatives, and the like.

The polishing composition according to the embodiment may be prepared also by dilution in use with water of stock liquid previously prepared so that other components than water are contained at relatively high concentrations. The dilution magnification is preferably no more than 50 times, more preferably no more than 40 times, particularly preferably no more than 25 times.

Next, the present invention will be further specifically described by examples and comparative examples.

Silicon dioxide, alkaline compounds, and water-soluble polymers were mixed in ion exchanged water to prepare polishing compositions of Examples 1 to 15 and Comparative Examples 1 to 7. Silicon dioxide, alkaline compounds, and water-soluble polymers contained in the polishing compositions are shown in detail in Table 1.

In the column of "silicon dioxide" in Table 1:
"A1" represents colloidal silica having an average primary particle diameter $D_{SA}$ of 7 nm and an average secondary particle diameter $D_{N4}$ of 15 nm,
"A2" represents colloidal silica having an average primary particle diameter $D_{SA}$ of 13 nm and an average secondary particle diameter $D_{N4}$ of 32 nm,
"A3" represents colloidal silica having an average primary particle diameter $D_{SA}$ of 26 nm and an average secondary particle diameter $D_{N4}$ of 90 nm,
"A4" represents colloidal silica having an average primary particle diameter $D_{SA}$ of 14 nm and an average secondary particle diameter $D_{N4}$ of 35 nm,
"A5" represents colloidal silica having an average primary particle diameter $D_{SA}$ of 35 nm and an average secondary particle diameter $D_{N4}$ of 70 nm,
"A6" represents colloidal silica having an average primary particle diameter $D_{SA}$ of 90 nm and an average secondary particle diameter $D_{N4}$ of 200 nm,
"B1" represents fumed silica having an average primary particle diameter $D_{SA}$ of 20 nm and an average secondary particle diameter $D_{N4}$ of 100 nm, and
"B2" represents fumed silica having an average primary particle diameter $D_{SA}$ of 40 nm and an average secondary particle diameter $D_{N4}$ of 250 nm In the column of "alkaline compound" in Table 1:
"AM" represents ammonia (29 wt % aqueous solution),
"PHA" represents potassium hydroxide,
"TMAH" represents tetramethylammonium hydroxide (25 wt % aqueous solution),
"PIZ" represents anhydrous piperazine.

In the column of "water-soluble polymer" in Table 1:
"HEC" represents hydroxyethyl cellulose having an average molecular weight of 1,200,000,
"PVA" represents polyvinyl alcohol having an average molecular weight of 62,000, an average degree of polymerization of 1400 and a saponification degree of 95%, and
"PEO" represents polyethylene oxide having an average molecular weight of 150,000 to 400,000.

The surface of the wafer (object to be polished) was precisely polished by the polishing compositions under the following conditions.

Polishing Conditions

Polishing machine: single-side polishing machine SPM-15 (Fujikoshi Machinery Corporation)

Object to be polished: Silicon wafer of φ60" (=150 mm) previously polished using a polishing material "GLANZOX-1101" (Fujimi Incorporated) (wherein, in the column of "Object to be polished" in Table 1, silicon wafer represented by "P++" has a resistivity of less than 0.01 Ω·cm, silicon wafer represented by "P+" has a resistivity of 0.01 Ω·cm or more and less than 0.1 Ω·cm, and silicon wafer represented by "P−" has a resistivity of 0.1 Ω·cm or more.).

Polishing load: 9.4 kPa

Surface plate revolution: 30 rpm

Wafer revolution: 30 rpm

Polishing pad: "Surfin 000" (Fujimi Incorporated)

Polishing time: 8 minutes

Speed of feeding polishing composition: 500 ml/min (continuous application)

In a wafer scrub-washed with pure water after precision polishing, haze level was measured by AMS-AWIS3110 (ADE Corporation). That having a haze level of less than 0.05 ppm was evaluated as oo, that of at least 0.05 ppm but less than 0.075 ppm was evaluated as o, that of at least 0.075 ppm but less than 0.1 ppm was evaluated as ▲, that of at least 0.1 ppm but less than 0.2 ppm was evaluated as x, and that of at least 0.2 ppm was evaluated as xx. The results are shown in the column of "haze" in Table 1.

The surface of the wafer scrub-washed with pure water after precision polishing was visually observed while illuminating with a spot light (500 klx) in a dark room. That showing entirely no scratch on the surface of the wafer was evaluated as oo, that showing scarcely no scratch was evaluated as o, that showing slight scratch was evaluated as ▲, and that showing significant scratch was evaluated as x. The results are shown in the column of "scratch" in Table 1.

When haze level was measured by AMS-AWIS3110 (ADE Corporation), that requiring a polishing time of less than 2 minutes until the count number of "Catch All" became 30 or less was evaluated as oo, that requiring a polishing time of at least 2 minutes but less than 3 minutes was evaluated as o, that requiring a polishing time of at least 3 minutes but less than 5 minutes was evaluated as ▲, and that requiring a polishing time of at least 5 minutes was evaluated as x. The results are shown in the column of "HFT" in Table 1. HFT is abbreviation for "Haze Free Time".

TABLE 1

| | Object to be polished | Silicon dioxide | | | Alkaline compound | | | Water-soluble polymer | | | Haze | Scratch | HFT |
|---|---|---|---|---|---|---|---|---|---|---|---|---|---|
| Ex. 1 | P++ | A1 | 0.5 | wt % | AM | 0.05 | wt % | HEC | 0.0125 | wt % | ○○ | ○○ | ▲ |
| Ex. 2 | P++ | A2 | 0.1 | wt % | AM | 0.05 | wt % | HEC | 0.0125 | wt % | ○○ | ○○ | ▲ |
| Ex. 3 | P++ | A2 | 0.5 | wt % | AM | 0.05 | wt % | HEC | 0.0125 | wt % | ○○ | ○○ | ○ |
| Ex. 4 | P++ | A2 | 1 | wt % | AM | 0.05 | wt % | HEC | 0.0125 | wt % | ○○ | ○○ | ○ |
| Ex. 5 | P++ | A3 | 0.5 | wt % | AM | 0.05 | wt % | HEC | 0.0125 | wt % | ○ | ○○ | ○ |
| Ex. 6 | P++ | A4 | 0.5 | wt % | AM | 0.05 | wt % | HEC | 0.0125 | wt % | ○○ | ○○ | ○ |
| Ex. 7 | P++ | B1 | 0.5 | wt % | AM | 0.05 | wt % | HEC | 0.0125 | wt % | ○○ | ○ | ○ |
| Ex. 8 | P++ | A2 | 0.5 | wt % | PHA | 0.015 | wt % | HEC | 0.0125 | wt % | ○○ | ○○ | ○ |
| Ex. 9 | P++ | A2 | 0.5 | wt % | TMAH | 0.025 | wt % | HEC | 0.0125 | wt % | ○○ | ○○ | ○ |
| Ex. 10 | P++ | A2 | 0.5 | wt % | PIZ | 0.015 | wt % | HEC | 0.0125 | wt % | ○○ | ○○ | ○ |
| Ex. 11 | P++ | A2 | 0.5 | wt % | AM | 0.025 | wt % | HEC | 0.0125 | wt % | ○○ | ○○ | ○ |
| | | | | | TMAH | 0.0125 | wt % | | | | | | |
| Ex. 12 | P++ | A2 | 0.5 | wt % | AM | 0.05 | wt % | PVA | 0.0125 | wt % | ○○ | ○○ | ▲ |
| Ex. 13 | P++ | A2 | 0.5 | wt % | AM | 0.05 | wt % | HEC | 0.0125 | wt % | ○○ | ○○ | ▲ |
| | | | | | | | | PEO | 0.005 | wt % | | | |
| Ex. 14 | P+ | A2 | 0.5 | wt % | AM | 0.05 | wt % | HEC | 0.0125 | wt % | ○○ | ○○ | ○○ |
| Ex. 15 | P− | A2 | 0.5 | wt % | AM | 0.05 | wt % | HEC | 0.0125 | wt % | ○○ | ○○ | ○○ |
| C. Ex. 1 | P++ | A5 | 0.5 | wt % | AM | 0.05 | wt % | HEC | 0.0125 | wt % | ▲ | ○○ | ○ |
| C. Ex. 2 | P++ | A6 | 0.5 | wt % | AM | 0.05 | wt % | HEC | 0.0125 | wt % | ▲ | ○○ | ○ |
| C. Ex. 3 | P++ | B2 | 0.5 | wt % | AM | 0.05 | wt % | HEC | 0.0125 | wt % | X | ▲ | ○ |
| C. Ex. 4 | P++ | A2 | 0.5 | wt % | — | | | HEC | 0.0125 | wt % | XX | ▲ | X |
| C. Ex. 5 | P++ | A2 | 0.5 | wt % | AM | 0.05 | wt % | — | | | XX | X | X |
| C. Ex. 6 | P+ | A5 | 0.5 | wt % | AM | 0.05 | wt % | HEC | 0.0125 | wt % | ▲ | ○○ | ○○ |
| C. Ex. 7 | P− | A5 | 0.5 | wt % | AM | 0.05 | wt % | HEC | 0.0125 | wt % | ○ | ○○ | ○○ |

As shown in Table 1, wafers precisely polished using the polishing compositions of Examples 1 to 15 showed excellent haze levels as compared with wafers precisely polished using the polishing compositions of Comparative Examples 1 to 7. Accordingly, it is apparent that the polishing compositions of Examples 1 to 15 have an effect of remarkably reducing the haze on the surface of the wafer.

The present examples and embodiments are to be considered as illustrative and not restrictive and the invention is not to be limited to the details given herein, but may be modified within the scope and equivalence of the appended claims.

The invention claimed is:

1. A polishing composition used in precision polishing a wafer surface, the polishing composition comprising:
   colloidal silica, wherein an average primary particle diameter $D_{SA}$ of the colloidal silica, which is obtained from a specific surface area of the colloidal silica measured by a BET method, is from 5 to 30 nm; wherein an average secondary particle diameter $D_{N4}$ of the colloidal silica, which is measured by a laser scattering method, is from 5 to 120 nm;
   an alkaline compound, wherein the alkaline compound is ammonia;
   a water-soluble polymer; and
   water.

2. The polishing composition according to claim 1, wherein the average primary particle diameter $D_{SA}$ of the colloidal silica is from 5 to 25 nm.

3. The polishing composition according to claim 2, wherein the average primary particle diameter $D_{SA}$ of the colloidal silica is from 5 to 20 nm.

4. The polishing composition according to claim 1, wherein the average secondary particle diameter $D_{N4}$ of the colloidal silica is from 5 to 100 nm.

5. The polishing composition according to claim 4, wherein the average secondary particle diameter $D_{N4}$ of the colloidal silica is from 5 to 80 nm.

6. The polishing composition according to claim 1, wherein the water-soluble polymer is at least one selected from hydroxyethyl cellulose, polyvinyl alcohol, and polyethylene oxide.

7. The polishing composition according to claim 6, wherein the water-soluble polymer is hydroxyethyl cellulose.

8. The polishing composition according to claim 7, wherein content of the hydroxyethyl cellulose in the polishing composition is from 0.005 to 1.5 wt %.

9. The polishing composition according to claim 1, wherein the content of colloidal silica in the polishing composition is from 0.1 to 40 wt %.

10. The polishing composition according to claim 1, wherein the content of colloidal silica in the polishing composition is from 0.1 to 1 wt %.

11. The polishing composition according to claim 7, wherein the content of the hydroxyethyl cellulose in the polishing composition is from 0.05 to 0.5 wt %.

12. The polishing composition according to claim 7, wherein the average molecular weight of the hydroxyethyl cellulose is from 300,000 to 3,000,000.

13. The polishing composition according to claim 1, wherein the content of the alkaline compound in the polishing composition is from 0.01 to 8 wt %.

14. The polishing composition according to claim 13, wherein the content of the alkaline compound in the polishing composition is from 0.1 to 3 wt %.

15. A polishing composition used in precision polishing a wafer surface, the polishing composition comprising:

colloidal silica, wherein an average primary particle diameter $D_{S4}$ of the colloidal silica, which is obtained from a specific surface area of the colloidal silica measured by a BET method, is from 5 to 20 nm, wherein an average secondary particle diameter $D_{N4}$ of the colloidal silica, which is measured by a laser scattering method, is from 5 to 80 nm, and wherein the content of colloidal silica in the polishing composition is from 0.1 to 40 wt %;

an alkaline compound, wherein the alkaline compound is ammonia;
a water-soluble polymer, wherein the water-soluble polymer is at least one selected from hydroxyethyl cellulose, polyvinyl alcohol, and polyethylene oxide; and
water.

* * * * *